(12) United States Patent
Niones et al.

(10) Patent No.: US 6,258,629 B1
(45) Date of Patent: Jul. 10, 2001

(54) ELECTRONIC DEVICE PACKAGE AND LEADFRAME AND METHOD FOR MAKING THE PACKAGE

(75) Inventors: Eulogia A. Niones; Nhun Thun Kham; Ludovico Bancod, all of Chandler, AZ (US); Yeon Ho Choi, Seoul (KR); Sean T. Crowley, Phoenix, AZ (US)

(73) Assignees: Amkor Technology, Inc., Chandler, AZ (US); Anam Semiconductor, Inc., Seoul (KR)

( * ) Notice: Subject to any disclaimer, the term of this patent is extended or adjusted under 35 U.S.C. 154(b) by 0 days.

(21) Appl. No.: 09/370,600

(22) Filed: Aug. 9, 1999

(51) Int. Cl.⁷ .............................. H01L 21/44; H01L 21/48
(52) U.S. Cl. ............................................... 438/111; 357/80
(58) Field of Search ..................................... 438/123, 125, 438/121, 106; 361/712; 174/52.4; 257/666, 675, 700, 701, 706, 707, 712, 773, 659

(56) References Cited

U.S. PATENT DOCUMENTS

| | | | |
|---|---|---|---|
| 4,771,330 | * 9/1988 | Long | 357/80 |
| 5,124,783 | * 6/1992 | Sawaya | 357/81 |
| 5,328,870 | 7/1994 | Marrs | 437/216 |
| 5,451,812 | 9/1995 | Gomi | 257/666 |

* cited by examiner

Primary Examiner—Matthew Smith
Assistant Examiner—Calvin Lee
(74) Attorney, Agent, or Firm—Skjerwen Morrill MacPherson LLP; James E. Parsons

(57) ABSTRACT

The present invention includes a package for housing an integrated circuit device. The present invention also includes leadframes and methods for making such packages. The package includes an integrated circuit device on a metal die pad. A metal ring is between the die pad and leads and surrounds the die pad. The ring is connected to the die pad by a nonconductive tape. Encapsulant material covers the entire structure. The ring is connected to a lead identified for connection to an external power voltage supply. The ring in turn is connected to a power voltage input pad on the integrated circuit device. The die pad floats, or is connected to a lead that is connected to an external ground voltage. The package is made from a leadframe that has a die pad, a metal ring between the die pad and radiating leads, and a nonconductive tape that connects the ring to the die pad. In one embodiment, the leadframe and package also include a bypass or decoupling capacitor attached between the die pad and the ring.

39 Claims, 10 Drawing Sheets

ELECTRONIC DEVICE PACKAGE AND LEADFRAME AND METHOD FOR MAKING THE PACKAGE

FIELD OF THE INVENTION

The present invention is to directed toward an improved plastic package for a semiconductor integrated circuit device and towards leadframes and methods for making such a package.

BACKGROUND OF THE INVENTION

Semiconductor integrated circuit devices, which are typically formed from silicon or gallium arsenide, are conventionally enclosed in plastic packages. The elements of such a package include a metal leadframe, an integrated circuit device, bonding material to attach the integrated circuit device to the leadframe, bond wires or other connectors that conductively connect metal pads on the integrated circuit device to individual leads of the leadframe, and a hard plastic encapsulant material that covers the other components and forms the exterior of the package.

FIG. 1 is a conventional metal leadframe 10. Although not shown, several identical leadframes 10 are formed in an array from a single sheet of metal and each leadframe of the array is processed in parallel.

Leadframe 10 includes a central metal die pad 11 (shown by horizontal hatching) and radiating metal leads 12 adjacent to die pad 11. An opposite end of each lead 12 is connected to the peripheral frame of the leadframe (not shown). A dam bar (not shown) also crosses and connects the leads. The frame and dam bar are removed during a trim and form step. The portion of each lead 12 that is within the dashed line is plated with silver. The perimeter of die pad 11 also may be plated. A ring of an adhesive polyimide tape 13 (shown by diagonal hatching) crosses and connects each of the leads 12 at a midpoint and serves to stabilize the leads during processing. Four tie bars 14 support die pad 11 and connect it to the peripheral dam bar and frame (not shown). Five leads 15 are connected to die pad 11 for support. Die pad 11 is downset, as indicated by downset marks 16 on tie bars 14 and leads 15.

An alternative prior art embodiment of a die pad shown is in FIG. 2. Metal die pad 20 is surrounded by a ring 21. Ring 21 is connected by sixteen metal connectors 22 to die pad 20. Tie bars 23 connect die pad 20 to the remainder of the peripheral frame of the leadframe (not shown). This configuration facilitates spacing of the leads (not shown) and provides an encapsulant locking feature.

In a completed package, the integrated circuit device is mounted on the die pad. Typically, integrated circuit devices require connection to power voltage source, sometimes denoted "Vdd," and a ground voltage source, sometimes denoted "Vss." A lead of the package typically is dedicated to supply Vdd. Sometimes, a second dedicated lead provides Vss. The use of dedicated leads for power and ground voltages, however, limits the flexibility of the package because the user of the package, for example, a chip manufacturer or computer manufacturer, cannot vary which leads are to be used for connection to input and output ("I/O") signals and which leads are to be used for connection to Vdd and Vss.

SUMMARY OF THE INVENTION

The present invention includes a package made from a leadframe having an inventive design. The package overcomes the limitations of prior art packages by allowing all leads of the package to be used for either I/O signals or power or ground leads. This allows a common package design to be used even when the location of the power voltage, ground voltage, and I/O signal inputs vary among different electronic devices.

A leadframe within the present invention includes a central metal die pad. A metal ring surrounds the die pad. The metal ring is spaced a small distance apart from the die pad. A nonconductive connector is attached between the die pad and the surrounding ring and holds the die pad and the ring together. An example nonconductive connector is a polyimide adhesive tape. A plurality of leads extend from the periphery of the leadframe toward the die pad and ring. The leads terminate adjacent to the ring. The ring is between the ends of the leads and the die pad. None of the leads directly connect to the ring. In an alternative embodiment, one or more of the leads is directly connected to the ring and provides support for the ring. Depending on the application of the package, a bypass capacitor or decoupling capacitor is connected between the die pad and the ring and filters the input power voltage.

The present invention also includes a method for making the leadframe described above. Step 1 of the method provides a metal sheet. Step 2 patterns the metal sheet to form the die pad, the surrounding ring, and the leads. At this initial stage, a temporary metal connector or a plurality of temporary metal connectors also are formed from the metal sheet and connect the die pad to the ring. Step 3 connects a nonconductive connector, such as polyimide adhesive tape, between the die pad and ring. A plurality of nonconductive connectors, such as two or four segments of tape, may be used to connect the die pad and ring. Step 4 removes the temporary metal connector(s) so that only the nonconductive connector(s) holds the die pad to the surrounding ring. Step 4 can be accomplished using several methods, including punching, etching, or laser cutting methods. Optionally, the tips of the leads and the periphery of the die pad are plated with another metal, such as silver, to facilitate connection to bond wires. Further, a bypass, decoupling, or filter capacitor may be connected between the die pad and the surrounding ring. Capacitor connection may be accomplished using a variety of methods, such as conductive adhesive or soft soldering methods.

A package made from the above-described leadframe includes the metal die pad, surrounding metal ring, nonconductive connector(s), and leads. An integrated circuit device is on the die pad. The leads are connected by conductors, e.g., bond wires, to conductive pads on the integrated circuit device. One of the leads is connected by a bond wire to the ring. Typically, the ring is connected to the lead that is attached to a power voltage input Vdd. The ring in turn is connected by a bond wire to a pad on the integrated circuit device for inputting the power voltage to the integrated circuit device. The die pad is isolated from the ring and is floating. In an alternative embodiment, a lead that attaches to ground voltage is connected by a bond wire to the die pad. A capacitor (filter, bypass, or decoupling) may be connected between the ring and the die pad. Hardened encapsulant material covers the entire structure, including the nonconductive connectors and the integrated circuit device.

A method of making the above package also is within the present invention. Step 1 of the method provides a leadframe having the features described above, including a central die pad, a surrounding ring separated from the die pad, a nonconductive connector holding the die pad to the ring, and radiating leads. Step 2 attaches an integrated circuit device to the die pad. Step 2 is accomplished using industry standard practices utilizing conductive or nonconductive organic epoxies or polyimides, as well as soft solders and conductive adhesive tapes. Step 3 installs conductive connectors between the integrated circuit device and the leads, between one or more of the leads and the ring, and between the ring and the integrated circuit device. Step 3 is accomplished using industry standard practices, such as wire bonding using thermosonic, thermo-compression, or ultrasonic wedge methods. Step 4 applies an encapsulant material over the entire structure. Typically, industry standard thermoset epoxies are used. These include Epoxidized ortho uresol novolac ("EOCN"), bi-phenyl ("BP"), dicyclopentadiene ("DCPD"), and multi-functional ("MF") epoxies. Step 5 hardens the encapsulant material. Finally, Step 6 trims and forms the leads.

The following detailed description will further describe aspects of the present invention.

DETAILED DESCRIPTION

Several of the figures described below have features in common. For common features, the same numbers typically are used in various figures.

Figure 1:
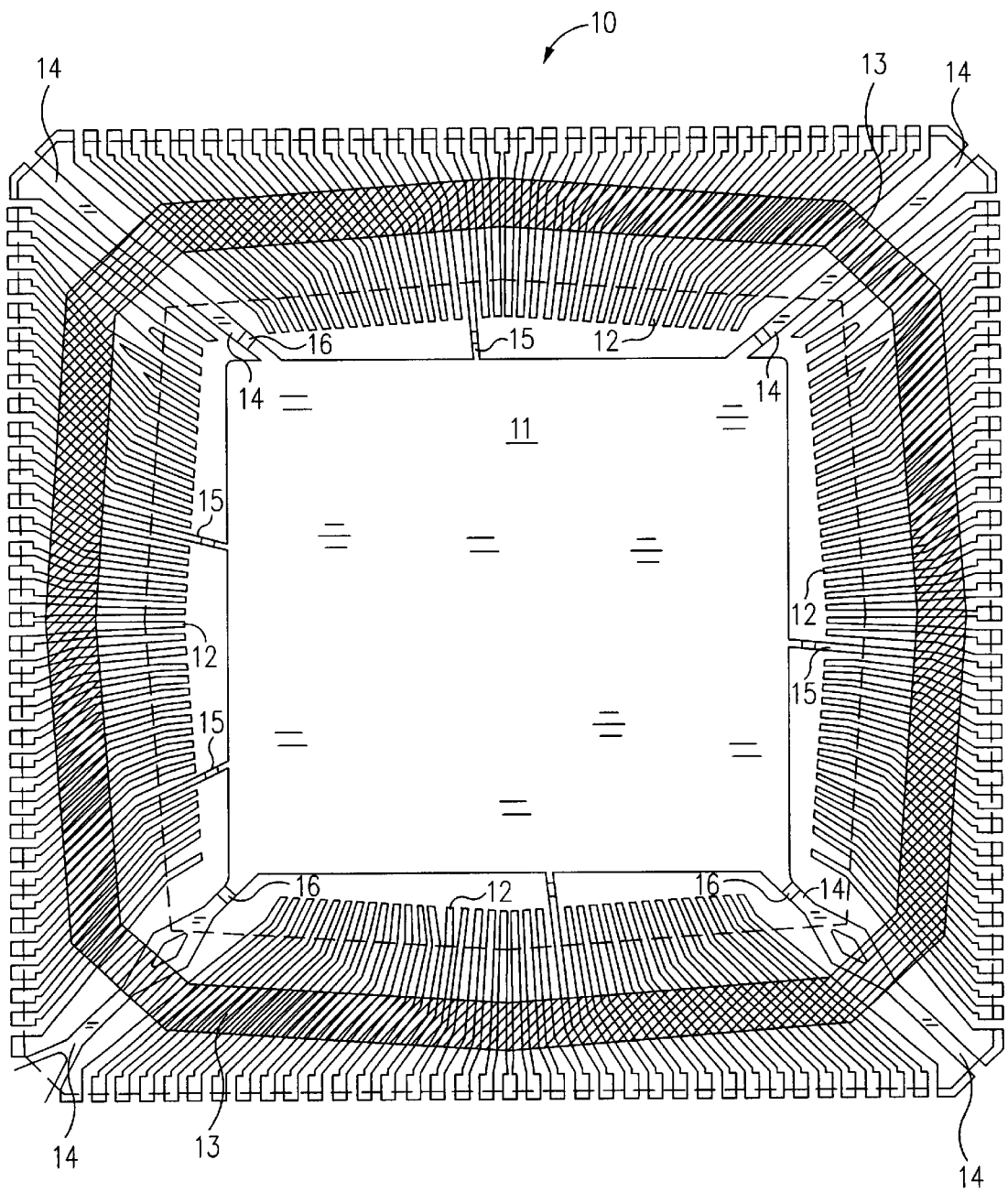
FIG. 1 is a top plan view of a prior art leadframe.
Figure 2:
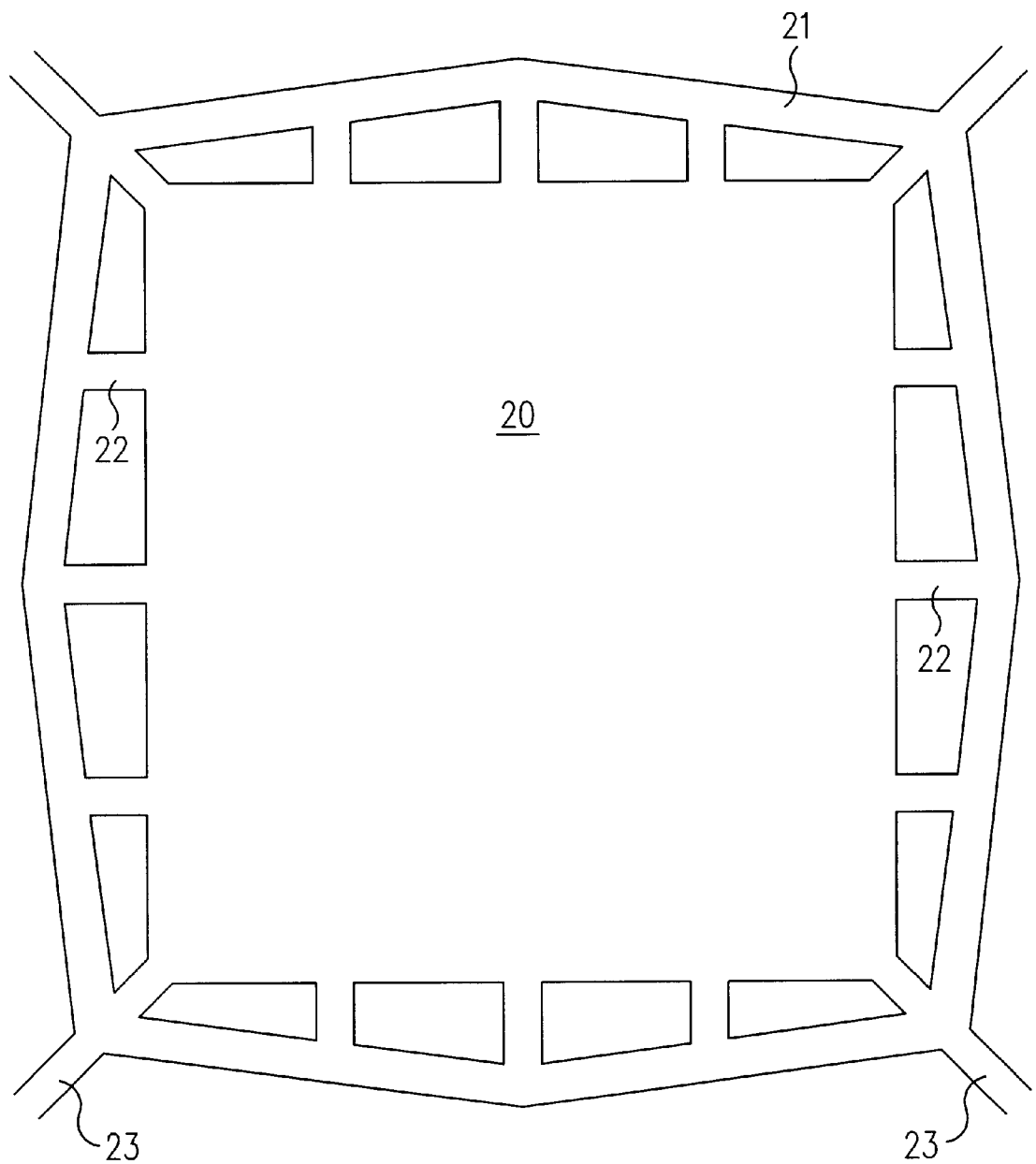
FIG. 2 is a top plan view of a prior art die pad connected by metal connectors to a surrounding metal ring.
Figure 3:
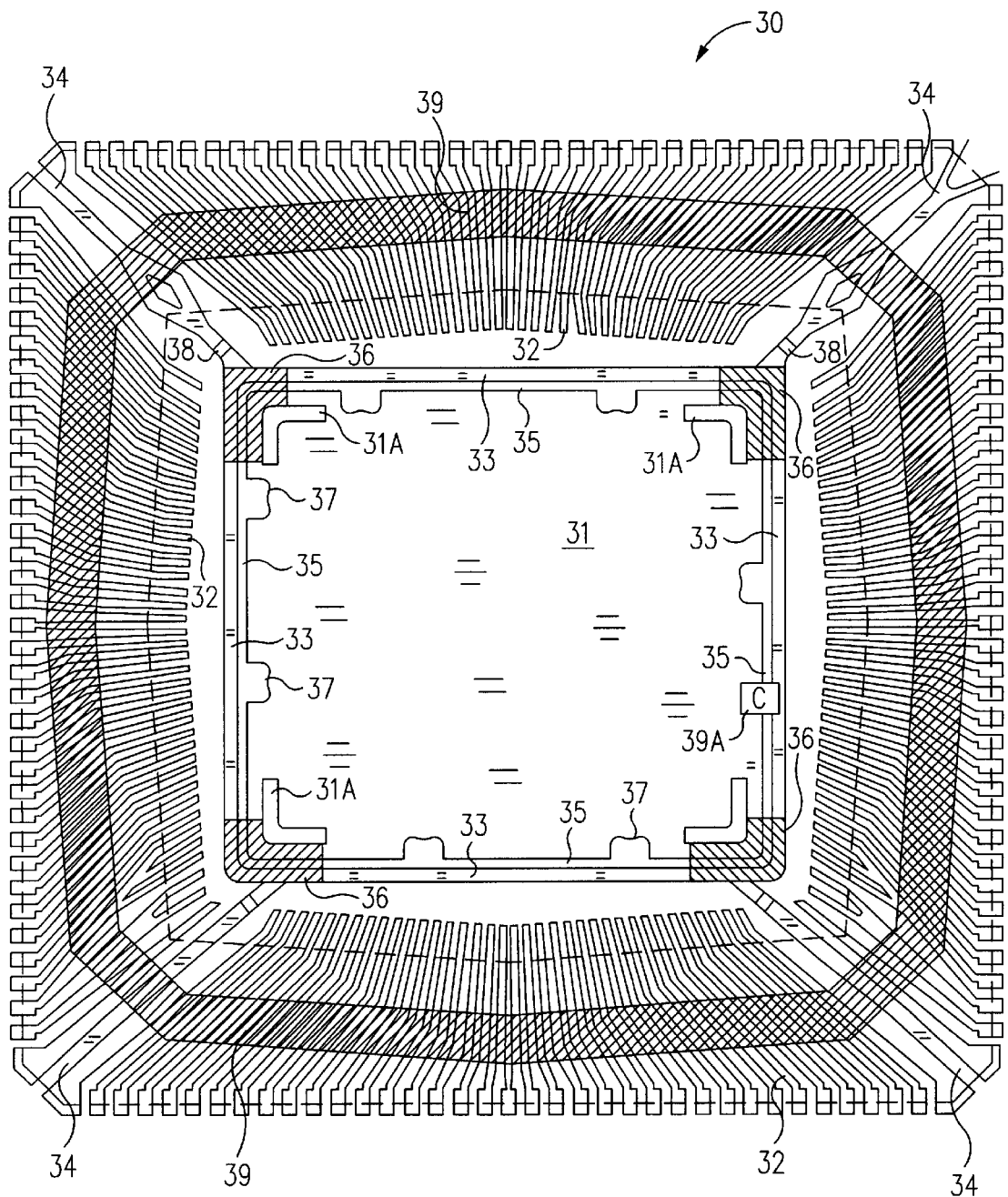
FIG. 3 is a top plan view of a leadframe having a rectangular die pad surrounded by a rectangular ring.
Figure 7:
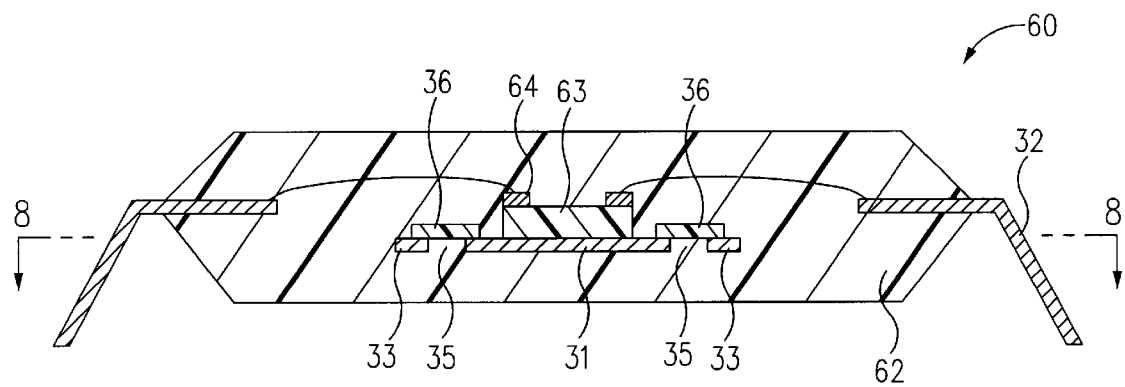
FIG. 7 is a cross-sectional side view of a package containing an integrated circuit device.
Figure 8:
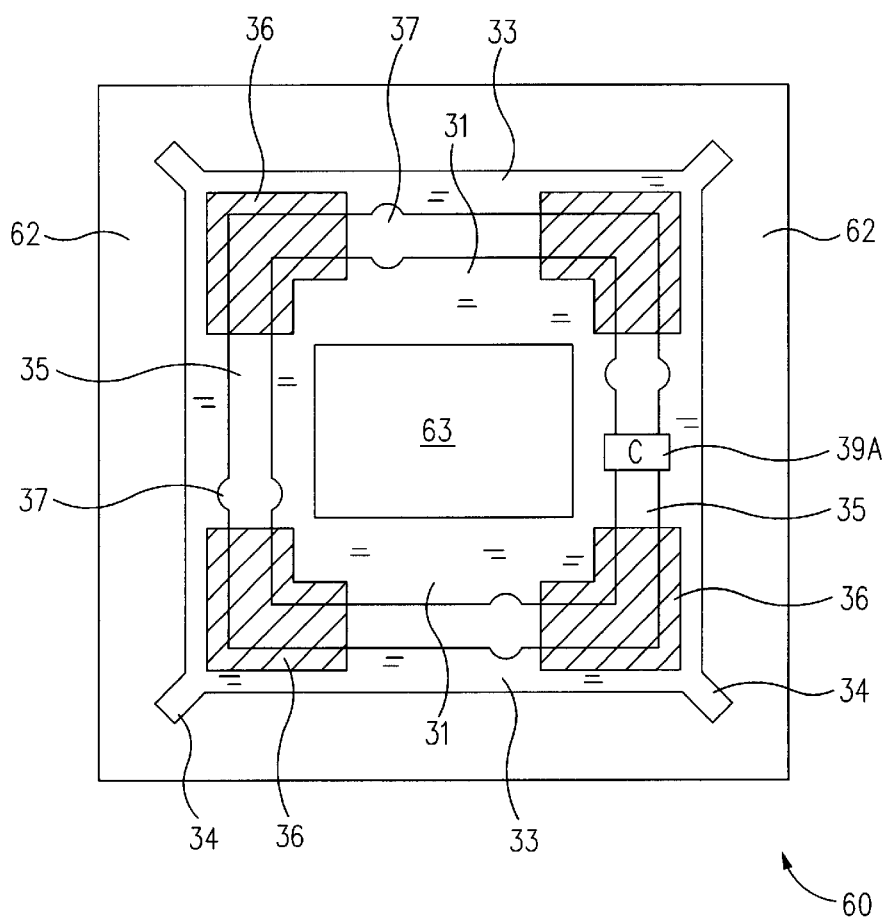
FIG. 8 is a plan view of the package of FIG. 7 along line 8—8.

FIG. 3 is an embodiment of a leadframe 30 within the present invention. FIGS. 7 and 8 show a package 60 for an integrated circuit device. Package 60 of FIG. 7 is made from leadframe 30 of FIG. 3. For clarity, package 60 is discussed first, followed by a discussion of leadframe 30 of FIG. 3.

Package 60 of FIG. 7 includes an integrated circuit device 63 attached onto a planar central metal die pad 31. Adjacent to either side of die pad 31 is a planar metal ring 33. Die pad 31 and ring 33 are downset. Although not shown in this view, ring 33 surrounds die pad 31. Segments of a nonconductive adhesive tape 36 connect ring 33 to a peripheral portion of die pad 31. Tape 36 spans space 35 between die pad 31 and ring 33. Conductive metal bond wires 61 connect leads 32 to conductive pads 64 on integrated circuit device 63. An insulative, adhesive encapsulant material 62 forms the package body and covers integrated circuit device 63, die pad 31, ring 33, tape 36, bond wires 61, and a portion of leads 32 adjacent to ring 33. In an alternative embodiment (not shown), the segments of nonconductive tape 36 are replaced with a contiguous nonconductive tape that connects the entire perimeter of die pad 31 to ring 33.

Although not shown in FIG. 7, a different lead 32 for carrying a power voltage Vdd is connected by a bond wire to ring 33, and ring 33 is connected by a separate bond wire 61 to a conductive pad 64 on integrated circuit device 63. Optionally, die pad 31 is connected to a different lead 32 carrying a ground voltage Vss. In another alternative embodiment (not shown), one or more leads are directly connected to ring 33.

FIG. 8 is a plan view of package 60 of FIG. 7 along line 8—8. As shown, ring 33 surrounds die pad 31. A space 35 filled by encapsulant material 62 is between die pad 31 and ring 33. Both die pad 31 and ring 33 have a rectangular perimeter. The four corners of die pad 31 and ring 33 are juxtaposed. The four corners of die pad 31 are each connected by a segment of nonconductive tape 36 (shown with diagonal hatching) to the juxtaposed corner of ring 33. Portions of severed tie bars 34 extend from ring 33 toward the perimeter of package 60. An optional capacitor 39A is connected between die pad 31 and ring 33, and acts as a filter between Vdd and Vss when the package is mounted on a printed circuit board and is in operation.

Package 60 of FIGS. 7 and 8 is formed of conventional materials. For example, die pad 31, ring 33, and leads 32 are formed of copper, copper alloy, or Alloy 42. The encapsulated tips of leads 32, ring 33, and a peripheral portion of die pad 31 may be plated with another conventional metal, such a silver or nickel palladium, to facilitate bond wire connections.

Nonconductive tape 36 is, for example, a conventional polyimide or polyimide-based tape, which is available from the E. I. Dupont Company of Delaware and Circleville, Ohio (United States), or from the Toray Dupont Company of Japan.

As stated above, package 60 was formed from leadframe 30 of FIG. 3. Leadframe 30 is a patterned planar metal sheet to which several pieces of a nonconductive adhesive tape have been applied.

Leadframe 30 of FIG. 3 includes a planar central metal die pad 31. Die pad 31 has a rectangular perimeter including four corners. Adjacent to the corners of die pad 31 is a space 31A, which provides an encapsulant locking feature in a completed package.

Die pad 31 of FIG. 3 is surrounded by planar metal ring 33. (For clarity, die pad 31 and ring 33 have horizontal cross hatches in FIG. 3.) Capacitor 39A is attached between die pad 31 and ring 33.

Ring 33 of FIG. 3 also has a rectangular perimeter, and the four corners of die pad 31 are juxtaposed with the four corners of ring 33. An empty space 35 is present around die pad 31 between die pad 31 and ring 33.

An "L" shaped segment of a nonconductive adhesive tape 36 connects a peripheral portion of each of the four corners of die pad 31 to the juxtaposed corner of ring 33. Tie bars 34 extend from the corners of ring 33 and connect ring 33 to the outer frame (not shown) of leadframe 30. Die pad 31 and ring 33 are downset, as indicated by downset marks 38.

Seven holes 37 are between die pad 31 and ring 33. Each hole 37 represents a point where a temporary metal connector between die pad 31 and ring 33 was removed after tape 36 was applied to connect die pad 31 and ring 33. The location of these temporary connectors can vary. For example, the temporary connectors could be located at the four corners in an alternative embodiment (not shown).

Leads 32 of leadframe 30 of FIG. 3 extend from the outer frame (not shown) of leadframe 30 toward ring 33. Leads 32 terminate adjacent to ring 33, and none of leads 32 contact ring 33. FIG. 3 includes 144 leads, although the number of leads will vary with the application. A dam bar (not shown) connects each of leads 32 until a trim and form step. A ring of a nonconductive adhesive tape 39 crosses and connects each of leads 32. Tape 39 stabilizes leads 32 during processing. Typically, the tips of leads 32 inside the dashed line are plated with silver, nickel palladium, or another common plating metal.

In a completed package (e.g., FIG. 7), any one of leads 32 of FIG. 3 may be connected to a voltage source or an I/O signal. During package assembly, a lead 32 is identified for connection to a power source vdd, and that lead is then connected to ring 33. Ring 33 is then connected by a bond wire or equivalent conductor to a power voltage Vdd input pad 64 on integrated circuit device 63 (FIG. 7). Die pad 31 may or may not be connected to a lead that is in turn connected to a ground voltage source Vss, depending on whether the application calls for connection of die pad 31 to an external ground voltage lead.

Figure 3A:
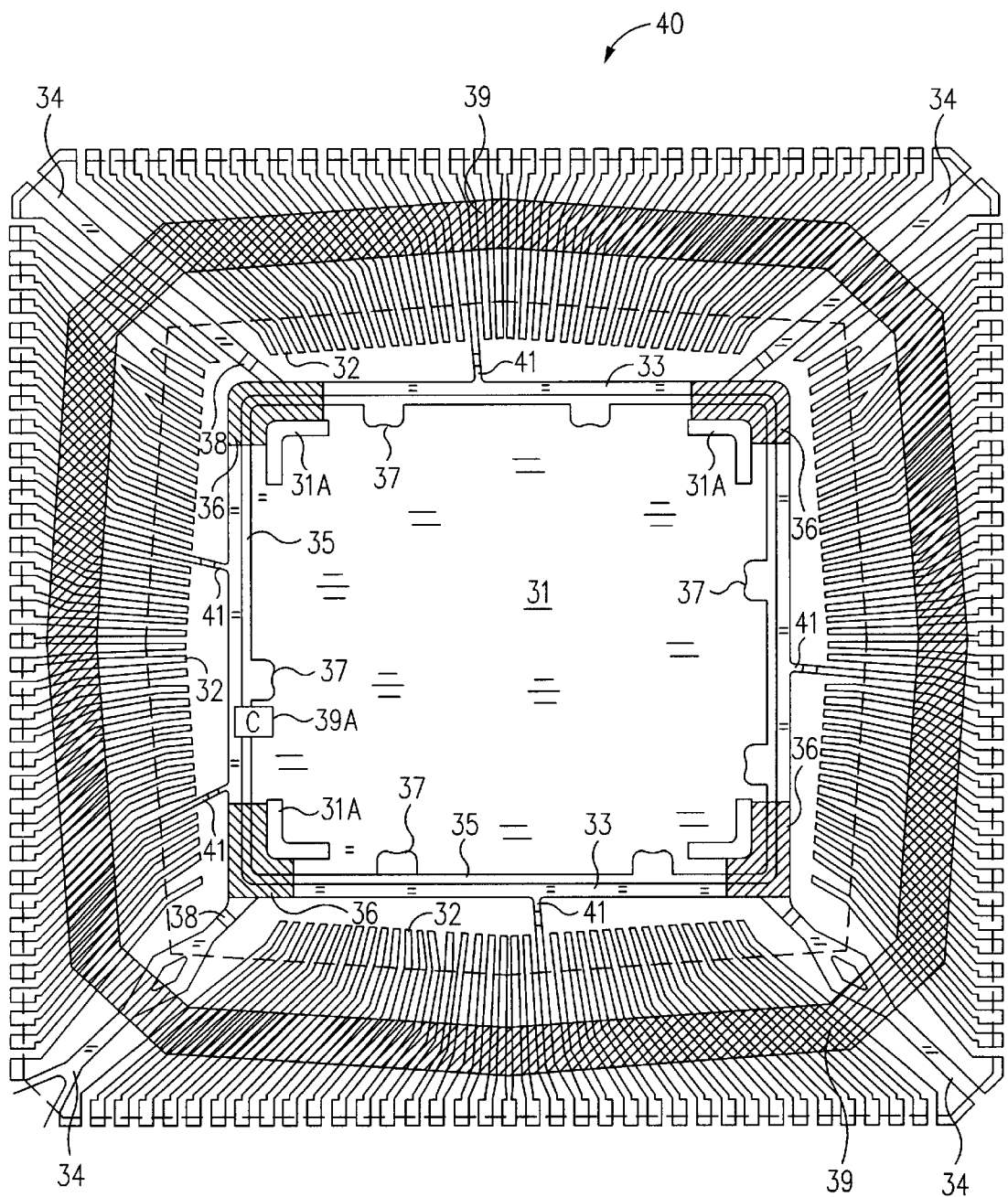
FIG. 3A is a top plan view of an alternative embodiment of the leadframe of FIG. 3.

FIG. 3A is an alternative embodiment of a leadframe. Leadframe 40 of FIG. 3A is identical to leadframe 30 of FIG. 3 except that ring 33 is directly connected to five downset leads 41. Leads 41 support ring 33 of leadframe 40. In one embodiment of a completed package made from leadframe 40, none of leads 41 is connected to an input. In such an embodiment, leads 41 only provide support to ring 33. In another alternative embodiment, one of leads 41 is identified for connection to the power voltage source Vdd, and a bond wire or equivalent conductor may be used to connect ring 33 to a power input pad on the integrated circuit device.

Figure 4:
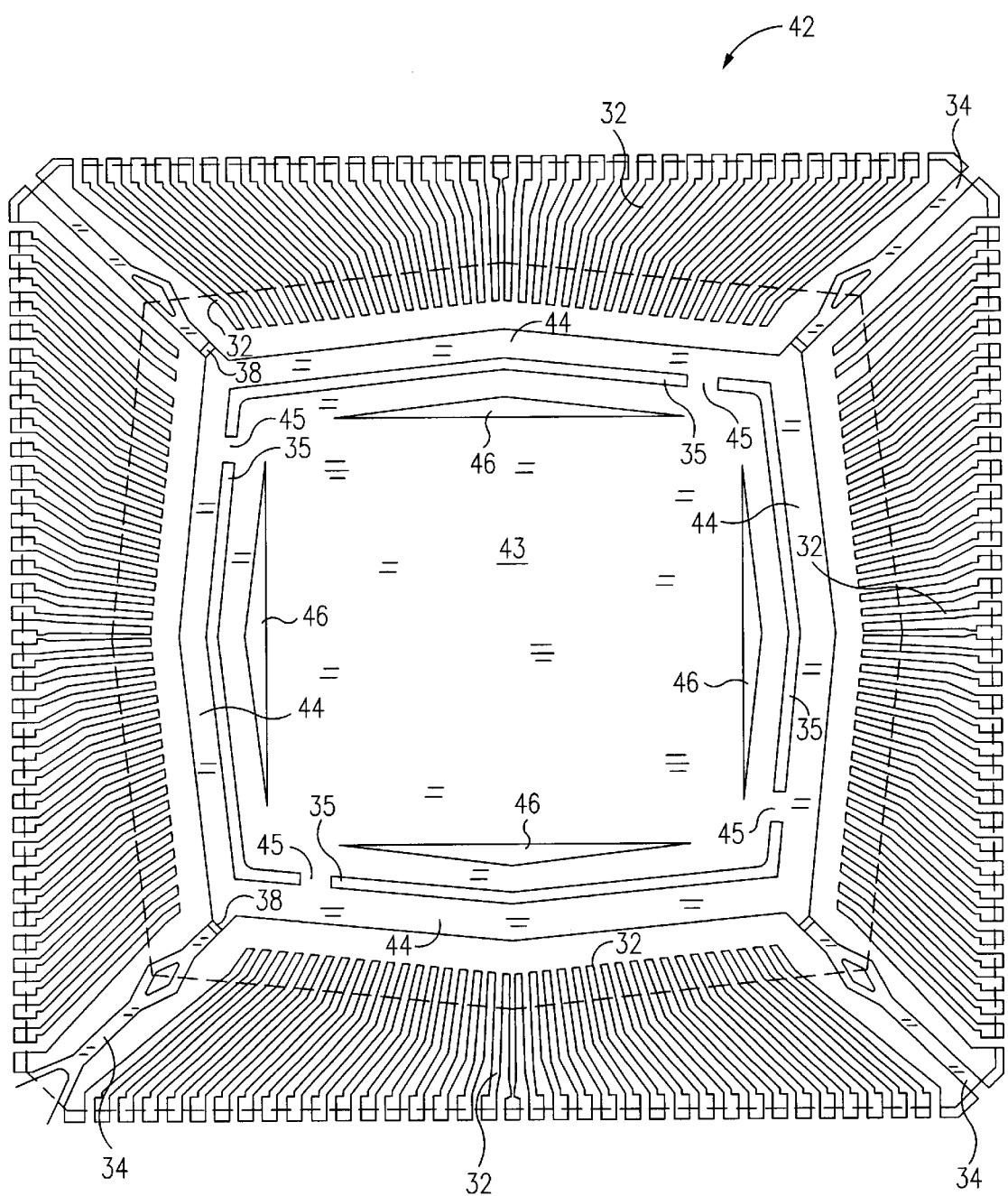
FIG. 4 is a top plan view of an incomplete leadframe having an octagonal die pad surrounded by an octagonal ring.

FIG. 4 is an incomplete leadframe 42 having an alternative die pad 43 and ring 44. Leadframe 42 is incomplete because four temporary metal connectors 45 connect metal die pad 43 and metal ring 44. In subsequent processing, temporary connectors 45 are removed after a nonconductive tape is applied to connect die pad 43 to ring 44. The octagonal perimeter shapes of die pad 43 and ring 44 of FIG. 4 facilitate the spacing of leads 32.

Die pad 43 of FIG. 4 has a perimeter with eight sides. In addition, the planar area of die pad 43 includes four spaces 46, which provide an encapsulant locking capability in a completed package. Ring 44 surrounds die pad 43 and has an eight-sided perimeter that matches the perimeter of die pad 43. Space 35 between die pad 43 and ring 44 is spanned by four temporary metal connectors 45 that connect die pad 43 to ring 44. In subsequent processing, temporary metal connectors 45 are removed. Ring 44 is connected to the outer frame (not shown) of leadframe 42 by four tie bars 34. Downset marks 38 show that die pad 43 and ring 44 are downset. Leads 32 extend from the outer frame (not shown) of leadframe 42 toward ring 44. No leads 32 directly contact ring 44.

In an alternative embodiment (not shown), the location of temporary metal connectors 45 is varied. For example, temporary connectors may be located at the juxtaposed corners of die pad 43 and ring 44 where the four tie bars 34 directly connect to ring 44.

Figure 4A:
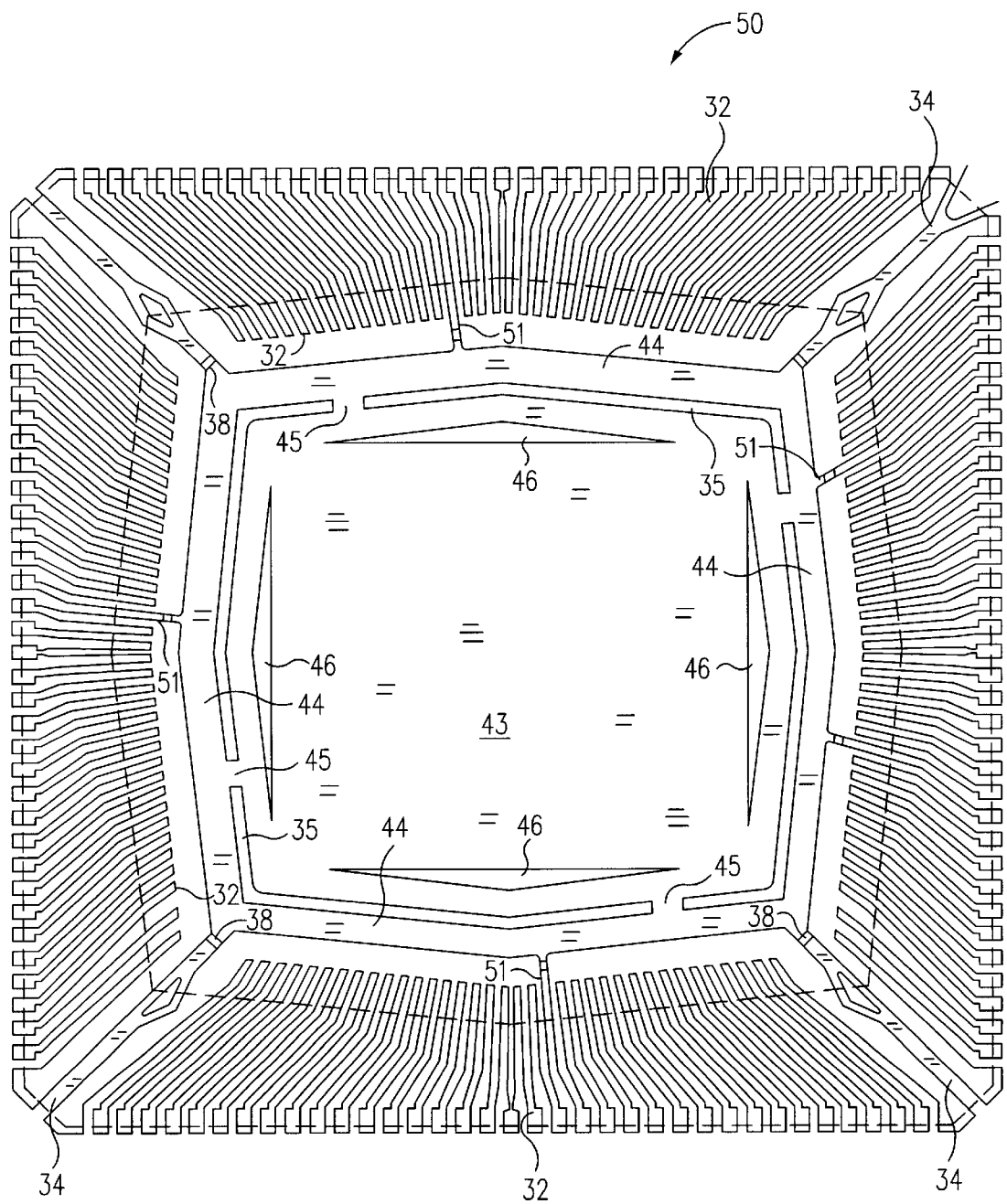
FIG. 4A is a top plan view of an alternative embodiment of the leadframe of FIG. 4.

FIG. 4A is an incomplete leadframe 50. Leadframe 50 of FIG. 4A is identical to leadframe 42 of FIG. 4 except that ring 44 is directly connected to five leads 51. Leads 51 support ring 44. In a completed package, leads 51 may or may not be connected to a power voltage input Vdd, as described above for FIG. 3A.

Figure 5:
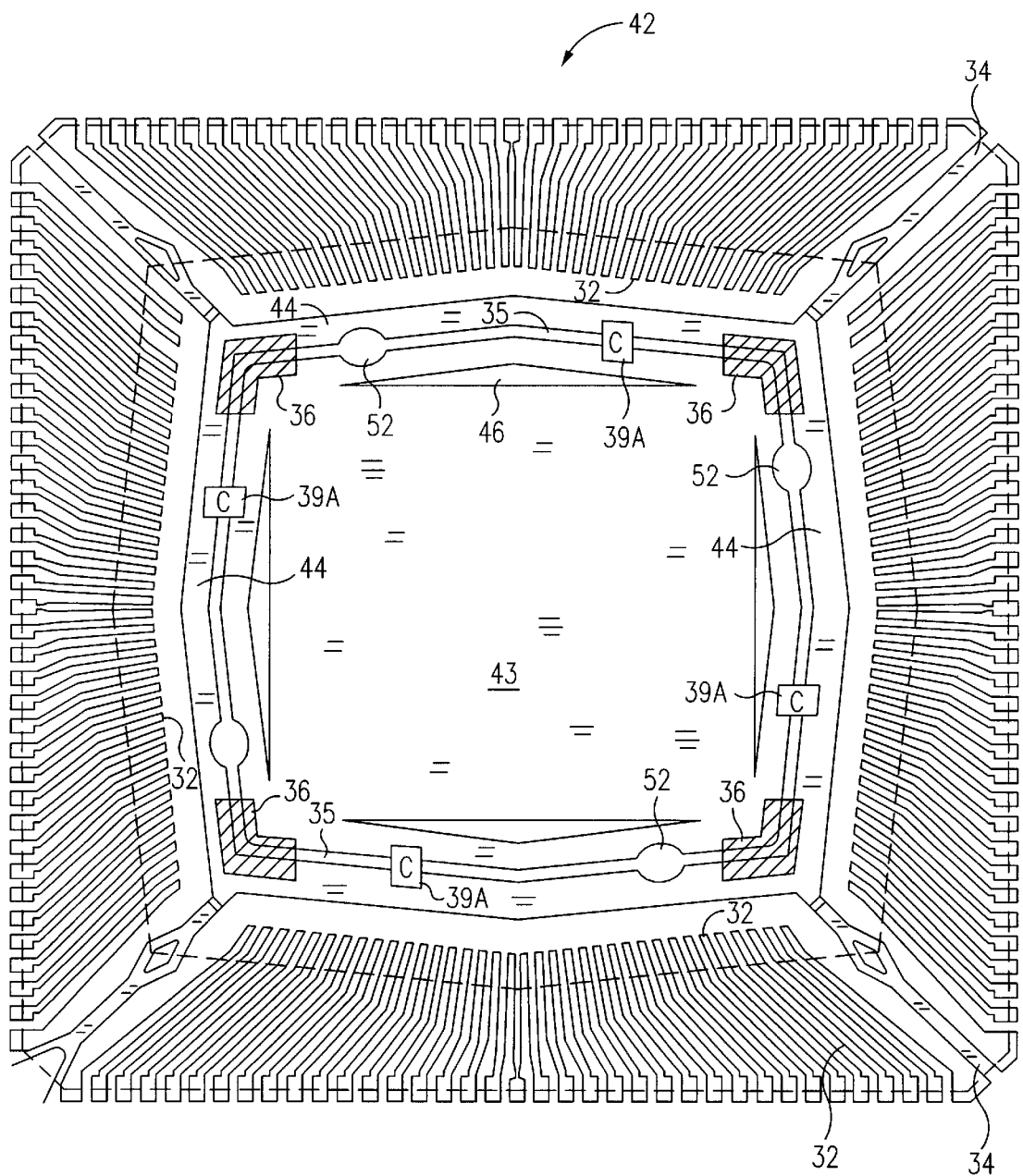
FIG. 5 is a top plan view of the leadframe of FIG. 4 after four nonconductive adhesive tape segments are applied to connect the die pad to the ring.

FIG. 5 shows leadframe 42 of FIG. 4 at a later stage of processing. In FIG. 5, four segments of a nonconductive tape 36 (shown by diagonal hatching) are attached to and connect four juxtaposed corners of metal die pad 43 and metal ring 44. Four holes 52 are between die pad 43 and ring 44. Holes 44 were made after nonconductive tape 36 was applied by punching out or otherwise removing temporary metal connectors 45 of FIG. 4. Four capacitors 39A are attached in a symmetrical fashion between die pad 43 and ring 44. More capacitors 39A can be accommodated based on the capacitance requirement and space limitations. Although not shown in FIG. 5, a ring of polyimide tape may be applied across all of leads 32, similar to tape 39 of FIG. 3, to stabilize leads 32 during processing.

Figure 6:
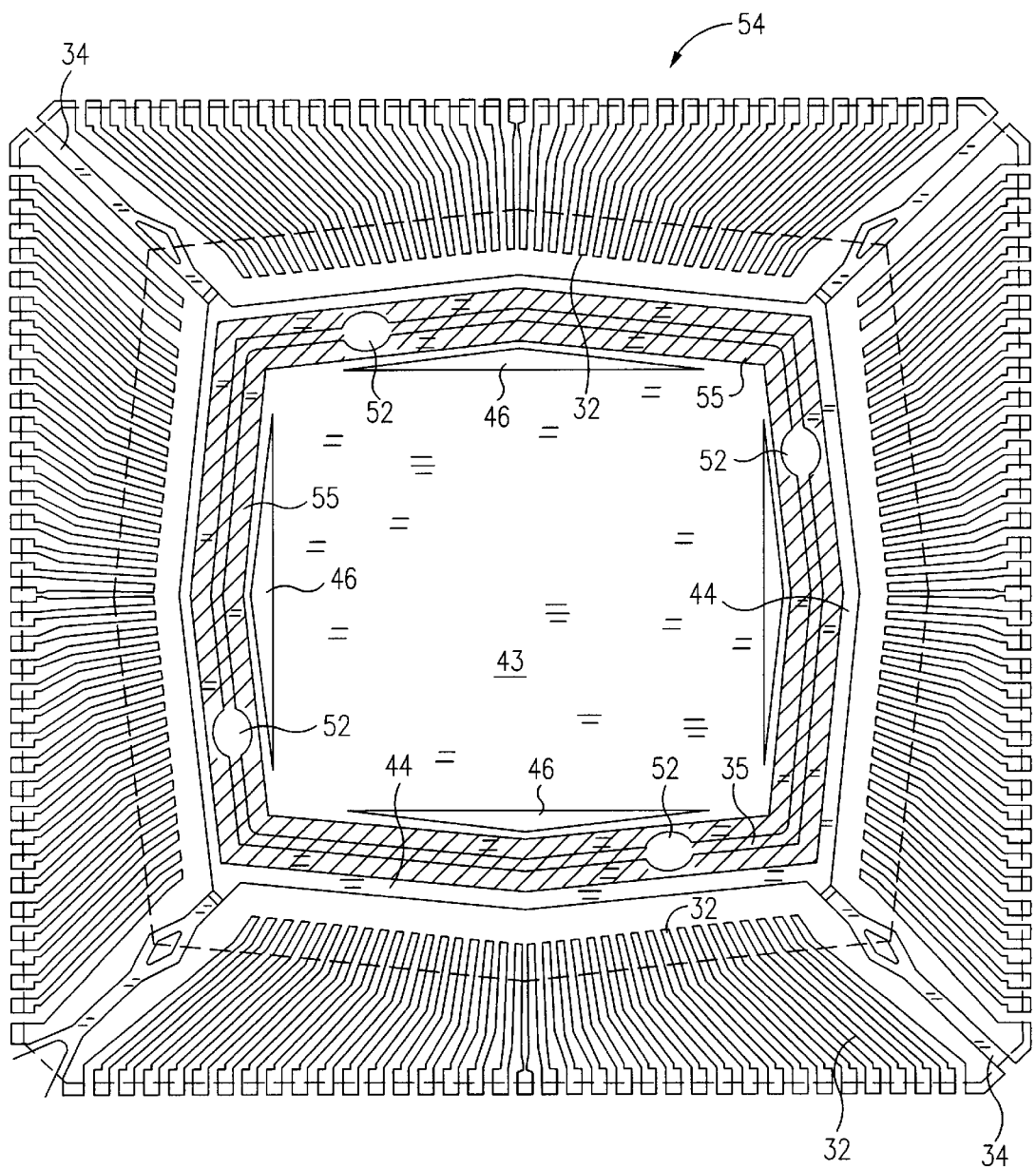
FIG. 6 is a top plan view of an alternative embodiment a leadframe having a ring of nonconductive tape between the die pad and surrounding ring.

FIG. 6 shows an alternative completed leadframe 54. Leadframe 54 is identical to leadframe 42 of FIG. 5 except for the configuration of the nonconductive tape that connects the peripheral portion of die pad 43 to surrounding ring 44. In FIG. 6, instead of four segments of a nonconductive tape 46 at juxtaposed corners, a ring of nonconductive tape 55 having the same perimeter shape as die pad 43 and ring 44 is attached between die pad 43 and ring 44 around their entire juxtaposed perimeters. Tape 55 is shown by diagonal cross hatching. In this embodiment, holes 52 are made by punching through tape 55 to remove temporary metal connectors 45.

Figure 9:
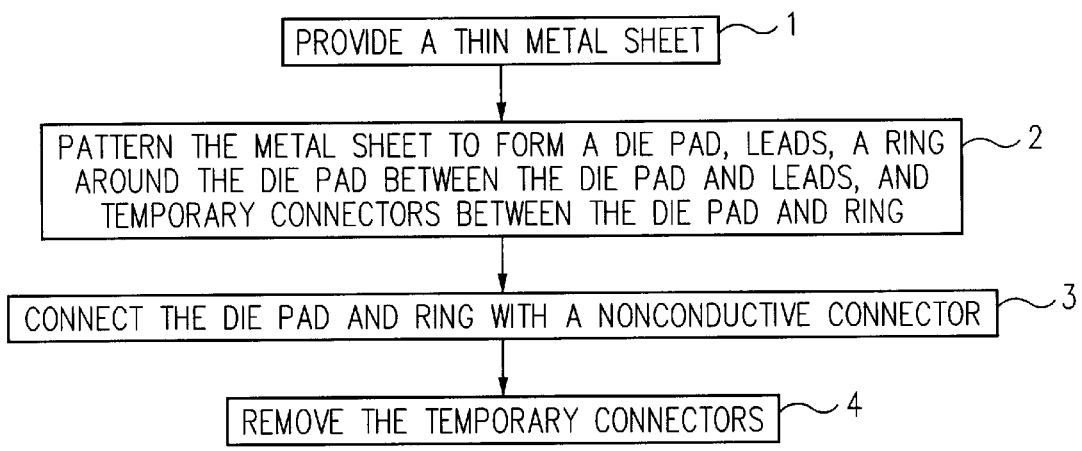
FIG. 9 is a flow chart of a method of making a leadframe.

FIG. 9 is a method within the present invention of making a leadframe such as leadframe 30 of FIG. 3, leadframe 40 of FIG. 3A, leadframe 42 of FIG. 5, and leadframe 54 of FIG. 6. Step 1 of the method of FIG. 9 provides a thin metal sheet. The metal sheet may be formed of any metal or metals conventionally used for making leadframes, such as copper, copper alloys, or Alloy 42.

Referring to FIG. 4 as an example leadframe for explaining FIG. 9, Step 2 of FIG. 9 patterns the metal sheet to form the metal portions of leadframe 42 of FIG. 4, including die pad 43, surrounding ring 44, tie bars 34, leads 32, and temporary connectors 45. Portions of leadframe 42 may be downset or plated.

Step 2 uses conventional patterning methods. Example patterning methods include etching the metal sheet using a liquid enchant and a photoresist mask, or progressive metal stamping. Typically, an array of leadframes will be formed from a single metal sheet and processed simultaneously. The end result is a metal strip including an array of identical leadframes that can undergo subsequent assembly in parallel.

Referring now to FIG. 5, Step 3 of FIG. 9 attaches a nonconductive connector, such as polyimide adhesive tape, to a peripheral portion of die pad 43 and to ring 44. The tape should overlap enough of the peripheral portion of die pad 43 and the width of ring 44 to provide a secure connection between die pad 43 and ring 44. In FIG. 5, four tape segments 45 are stamped onto or otherwise applied to four juxtaposed corners of die pad 43 and ring 44. Some balancing of the amount of tape and package performance is required. Greater amounts of tape (such as in FIG. 6) provide greater attachment and stability, but may cause the package to absorb greater amounts of moisture. In addition, a ring of tape also may be applied across leads 32, along the lines of tape 39 of FIG. 3.

Step 4 of FIG. 9 removes the temporary metal connectors that hold die pad 43 to ring 44. Referring to FIG. 5, this step is performed by punching out temporary connectors 45. Alternatively, Step 4 can be accomplished by etching or laser cutting methods. At the completion of this step, only the four segments of nonconductive tape 36 hold die pad 43 to ring 44. In an alternative leadframe embodiment (not shown) where temporary connectors 45 are located beneath tape 36 where tie bars 34 intersect ring 44, then Step 4 requires punching or otherwise piercing through tape segments 36.

Optionally, capacitors 39A are connected between die pad 43 and ring 44, depending on the requirements of the package. The capacitors may be any variety of sizes, based on the capacitance required and space available. A common size for this application has a 0402 body size.

Figure 10:
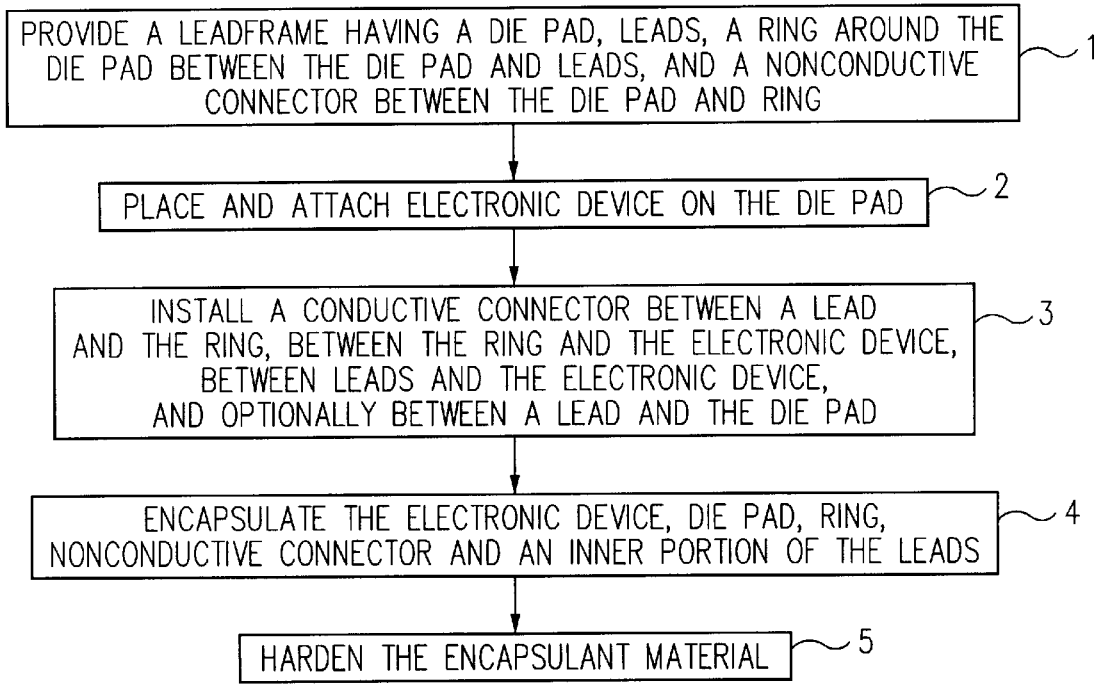
FIG. 10 is a flow chart of a method of making a package.

FIG. 10 is a flow chart of a method within the present invention of making a package using the above described leadframes. FIGS. 7 and 8 show a package made by the process.

Step 1 of FIG. 10 provides a leadframe having the features exemplified in FIGS. 3, 5, or 6. Referring to FIG. 3 as an example leadframe, Step 1 provides a leadframe 30. As discussed above, leadframe 30 includes a central metal die pad 31 and a metal ring 33 that surrounds die pad 31 and is spaced apart from die pad 31 by a space 35. Leadframe 30 also includes four segments of a nonconductive connection tape 36 that connect peripheral portions of die pad 43 to ring 44. Leadframe 30 also includes a plurality of leads 32 that begin adjacent to ring 44 and terminate at the periphery of the leadframe.

Referring to FIG. 7, Step 2 of FIG. 10 attaches an integrated circuit device to die pad 31. Conventional die attach equipment, adhesives, and methods can be used.

Step 3 installs conductive connectors, such as bond wires or equivalent, between the integrated circuit device and the components of the leadframe. Conventional wire bonding methods can be used. For example, referring to FIGS. 3 and 7, a bond wire is connected between a lead 32 and ring 33 to provide input power voltage Vdd to ring 33. Another bond wire is connected between ring 33 and a Vdd input pad on integrated circuit device 63. Other leads are connected by bond wires to I/O signal pads on integrated circuit device 63. Depending on the application, die pad 31 may float, or a bond wire may be used to connect die pad 31 to a lead 32 that is to be connected to an external ground voltage.

Step 4 of FIG. 10 applies an insulative, adhesive encapsulant material over the entire structure. Referring to FIG. 7, encapsulant material 62 covers integrated circuit device 63, bond wires 61, die pad 31, ring 33, nonconductive tape 36, and the portion of leads 32 adjacent to ring 33. Conventional encapsulation techniques, such as transfer or injection molding, are used. Conventional encapsulant materials, such as epoxy resins, are used.

Step 5 of FIG. 10 hardens the encapsulant material by conventional methods, such as heating. Finally, Step 6 of trims and forms the encapsulated package. If a plurality of packages are processed simultaneously using an array of leadframes, then individual packages must be separated from the array. Sawing or punching to separate the packages may be used.

The embodiments described herein are merely examples of the present invention. Artisans will appreciate that variations are possible within the scope of the claims.

What is claimed is:

1. A method of making a leadframe comprising:
providing a metal sheet;
patterning the metal sheet to form a first surface, a second surface, and leads, wherein the second surface surrounds the first surface, the second surface is separate from the first surface, and the second surface is between the leads and the first surface; and
connecting the first surface and the second surface with a nonconductive connector.

2. The method of claim 1, wherein patterning the metal sheet includes forming a temporary metal connector between the first surface and the second surface; and further comprising
removing said temporary metal connector after connecting said nonconductive connector.

3. The method of claim 2, wherein connecting a nonconductive connector includes applying an adhesive tape to connect the first surface and the second surface.

4. The method of claim 2, wherein connecting the first surface and the second surface includes connecting a plurality of nonconductive connectors between the first and second surfaces.

5. The method of claim 4, wherein a portion of at least one of the nonconductive connectors overlies the temporary metal connector, and removing said temporary metal connector also comprises removing the overlying portion of the nonconductive connector.

6. The method of claim 4, wherein connecting a plurality of the nonconductive connectors includes applying a plurality of segments of an adhesive tape to connect the first surface and the second surface.

7. The method of claim 2, wherein connecting a nonconductive connector includes connecting a ring of the nonconductive connector over a circumferential portion of the first surface and the second surface.

8. The method of claim 7, wherein a portion of the ring of the nonconductive connector overlies the temporary connector, and removing said temporary metal connector also comprises removing the overlying portion of the nonconductive connector.

9. The method of claim 8, wherein the nonconductive connector is an adhesive tape.

10. The method of claim 7, wherein the nonconductive connector is an adhesive tape.

11. The method of claim 1, wherein connecting a nonconductive connector includes applying an adhesive tape to connect the first surface and the second surface.

12. The method of claim 11, wherein a plurality of segments of the adhesive tape are applied between the first surface and the second surface.

13. The method of claim 11, wherein the adhesive tape is a ring of the adhesive tape applied over a circumferential portion of the first surface and the second surface.

14. The method of claim 1, wherein connecting the first surface and the second surface includes connecting a plurality of nonconductive connectors between the first and second surfaces.

15. The method of claim 1, further comprising connecting a capacitor between the first surface and the second surface.

16. The method of claim 15, wherein connecting a nonconductive connector includes applying an adhesive tape to connect the first surface and the second surface.

17. The method of claim 16, wherein a plurality of segments of the adhesive tape are applied between the first surface and the second surface.

18. The method of claim 16, wherein a ring of the adhesive tape is applied over a circumferential portion of the first surface and the second surface.

19. The method of claim 1, wherein connecting a nonconductive connector includes connecting a ring of the nonconductive connector over a circumferential portion of the first surface and the second surface.

20. The method of claim 19, wherein the nonconductive connector is an adhesive tape.

21. A method of making a package for an integrated circuit device comprising:

provoking a leadframe, wherein said leadframe includes a metal first surface, a metal second surface, metal leads, and a nonconductive connector, wherein the second surface surrounds the first surface, the second surface is separate from the first surface, and the second surface is between the first surface and the leads, and the nonconductive connector connects the first surface and the second surface;

placing an integrated circuit device on the first surface and electrically connecting the integrated circuit device to the leadframe;

applying an encapsulant material so that the integrated circuit device and nonconductive connector are covered with the encapsulant material; and hardening the encapsulant material.

22. The method of claim 21, wherein electrically connecting the integrated circuit device to the leadframe comprises:

placing a conductive first connector between the integrated circuit device and a lead;

placing a conductive second connector between the integrated circuit device and the second surface; and placing a conductive third connector between a lead and the second surface.

23. The method of claim 22, wherein the nonconductive connector is an adhesive tape.

24. The method of claim 23, wherein the first, second, and third conductive connectors are metal bond wires.

25. The method of claim 23, wherein the adhesive tape has the form of a ring connecting a circumferential portion of the first surface to the second surface.

26. The method of claim 23, wherein the adhesive tape comprises a plurality of segments of the adhesive tape connecting the first surface and the second surface.

27. The method of claim 22, further comprising placing a conductive fourth connector between the first surface and a lead.

28. The method of claim 21, wherein said leadframe includes a lead directly connected to said second surface.

29. The method of claim 21, wherein said nonconductive connector is an adhesive tape.

30. The method of claim 29, wherein a capacitor is connected between said first surface and said second surface of the leadframe.

31. The method of claim 29, wherein said leadframe includes a lead directly connected to said second surface, and electrically connecting the integrated circuit device to the leadframe comprises:

placing a conductive first connector between the integrated circuit device and a lead; and placing a conductive second connector between the integrated circuit device and the second surface.

32. The method of claim 29, wherein the adhesive tape has the form of a ring connecting a circumferential portion of the first surface to the second surface.

33. The method of claim 29, wherein the adhesive tape comprises a plurality of segments of the adhesive tape connecting the first surface and the second surface.

34. The method of claim 21, wherein a capacitor is connected between said first surface and said second surface.

35. The method of claim 34, wherein the nonconductive connector comprises a ring of an adhesive tape connecting a circumferential portion of the first surface to the second surface.

36. The method of claim 34, wherein the nonconductive connector comprises a plurality of segments of an adhesive tape connecting the first surface and the second surface.

37. The method of claim 21, wherein said leadframe includes a lead directly connected to said second surface, and electrically connecting the integrated circuit device to the leadframe comprises:

placing a conductive first connector between the integrated circuit device and a lead; and placing a conductive second connector between the integrated circuit device and the second surface.

38. The method of claim 37, wherein the first and second conductors are metal bond wires.

39. A method of making a leadframe comprising:

providing a metal sheet;

patterning the metal sheet to form a first surface, a second surface, and leads, wherein the second surface surrounds the first surface, the second surface is separate from the first surface, and the second surface is between the leads and the first surface; and step for connecting the first surface and the second surface so that the first surface is electrically isolated from the second surface.

* * * * *

UNITED STATES PATENT AND TRADEMARK OFFICE
CERTIFICATE OF CORRECTION

PATENT NO. : 6,258,629 B1
DATED : July 10, 2001
INVENTOR(S) : Eulogia A. Niones; Nhun Thun Kham; Ludovico Bancod; Yeon Ho Choi; Sean T. Crowley It is certified that error appears in the above-identified patent and that said Letters Patent is hereby corrected as shown below:

Column 1,
Line 53, after "connection to" insert -- a --;

Column 2,
Line 57, after "to" and before "ground" insert -- a --;

Column 4,
Lne 33, before "silver" delete "a" and insert -- as --;

Column 6,
Line 10, delete "44 were" and insert -- 52 were --;

Column 7,
Line 25, after "die pad" delete "43" and insert -- 31 --; and
Line 26, delete "44." and insert -- 33. --; and
Line 27, after "to ring" delete "44" and insert -- 33 --; and
Line 30, after "integrated circuit device" insert -- 63 --; and
Line 39, after "bond wires" insert -- 61 --; and
Line 41, after "application," insert -- the potential of --; and
Line 53, "Step 6 of" insert -- Figure 10 --.

Signed and Sealed this

Twelfth Day of March, 2002

*Attest:*

*Attesting Officer*

JAMES E. ROGAN
*Director of the United States Patent and Trademark Office*